(12) United States Patent
Standley et al.

(10) Patent No.: US 7,994,858 B2
(45) Date of Patent: Aug. 9, 2011

(54) OPERATIONAL TRANS-CONDUCTANCE AMPLIFIER WITH OUTPUT CLAMP CIRCUIT

(75) Inventors: David Standley, Westlake Village, CA (US); Laurent Blanquart, Westlake Village, CA (US)

(73) Assignee: AltaSens, Inc., Westlake Village, CA (US)

( * ) Notice: Subject to any disclaimer, the term of this patent is extended or adjusted under 35 U.S.C. 154(b) by 93 days.

(21) Appl. No.: 12/454,320

(22) Filed: May 15, 2009

(65) Prior Publication Data

US 2010/0289580 A1    Nov. 18, 2010

(51) Int. Cl.
    H03F 3/45    (2006.01)
(52) U.S. Cl. ..................................... 330/253; 330/257
(58) Field of Classification Search ............. 330/253, 330/257
    See application file for complete search history.

(56) References Cited

U.S. PATENT DOCUMENTS

| 5,036,218 | A |   | 7/1991 | Jaquette |   |
|---|---|---|---|---|---|
| 5,381,054 | A |   | 1/1995 | Standley |   |
| 5,952,882 | A | * | 9/1999 | Kolluri | 330/255 |
| 5,973,534 | A |   | 10/1999 | Singh |   |
| 7,301,401 | B2 | * | 11/2007 | Pennock | 330/277 |
| 7,342,450 | B2 | * | 3/2008 | Jones | 330/253 |
| 7,557,658 | B2 | * | 7/2009 | Perez | 330/255 |
| 7,777,574 | B1 | * | 8/2010 | Nielsen | 330/296 |
| 2003/0058049 | A1 |   | 3/2003 | Tran et al. |   |
| 2005/0007195 | A1 |   | 1/2005 | Schrader |   |
| 2006/0109056 | A1 |   | 5/2006 | Colbeck |   |
| 2006/0152283 | A1 |   | 7/2006 | Dashtestani et al. |   |

OTHER PUBLICATIONS

International Search Report.
Chang et al, A CMOS Differential Buffer Amplifier with Accurate Gain and Clipping Control, IEEE Journal of Solid-State Circuits, vol. 30, No. 7, pp. 731-735, Jul. 1995.
Huang et al., A 2-V 10.7 MHz CMOS Limiting Amplifier/RSSI, IEEE Journal of Solid-State Circuits, vol. 35, No. 10, pp. 1474-1480, Oct. 2000.
Khorram et al., A CMOS Limiting Amplifier and Signal Strength Indicator, 1995 Symposium on VLSI Circuits Digest of Technical Papers, pp. 95-96, 1995.
Berger et al., Superintegrated Voltage Clamp, IEEE Journal of Solid-State Circuits, pp. 231-232, Jun. 1973.

* cited by examiner

*Primary Examiner* — Patricia Nguyen
(74) *Attorney, Agent, or Firm* — Reed Smith LLP

(57) ABSTRACT

An operational trans-conductance amplifier circuit having a voltage clamp circuit. The clamp circuit utilizes low area and power overhead, has a sharp clamp characteristic, and little degradation in the small-signal DC gain at the "knee" of the clamp characteristic. The clamp circuit includes a comparator circuit and a current control circuit. The amplifier and clamp circuits may further include a clamp voltage generator circuit.

24 Claims, 9 Drawing Sheets

OPERATIONAL TRANS-CONDUCTANCE AMPLIFIER WITH OUTPUT CLAMP CIRCUIT

BACKGROUND OF THE INVENTION

1. Field of the Invention

The present invention relates generally to electronic circuits; and more particularly to operational trans-conductance amplifier circuits having an output voltage clamp circuit.

2. Description of the Related Art

The operational trans-conductance amplifier, or OTA, is a widely used circuit block in analog and mixed-signal VLSI applications. As a standalone circuit, it has an output voltage range that is determined by a combination of the device parameters, the input voltage, and the DC load current at its output. As such, it is generally not well defined. It is often desirable to limit, or clamp, the output voltage so that it does not go outside a specified range, where the range can be readily controlled.

Standard high-performance voltage clamp circuits often use a separate block to make the required comparison between the actual output voltage and a desired threshold value. This requires more area and power. While there are simpler clamp circuits that use a few elements or even a single diode, these circuits do not provide a sharp "knee" (i.e. a sharp clamping characteristic).

An example of a high-performance clamp circuit of the prior art is disclosed in Chang et al, A CMOS Differential Buffer Amplifier with Accurate Gain and Clipping Control, IEEE Journal of Solid-State Circuits, Vol. 30, No. 7, pgs. 731-735, July, 1995. Examples of the simpler circuits are disclosed in: Huang et al., A 2-V 10.7 MHz CMOS Limiting Amplifier/RSSI, IEEE Journal of Solid-State Circuits, Vol. 35, No. 10, pgs. 1474-1480, October 2000; Khorram et al., A CMOS Limiting Amplifier and Signal Strength Indicator, 1995 Symposium on VLSI Circuits Digest of Technical Papers, pgs. 95-96, 1995; Berger et al., Superintegrated Voltage Clamp, IEEE Journal of Solid-State Circuits, pgs. 231-232, June, 1973. Furthermore, U.S. Pat. No. 5,036,218 discloses a circuit (with variations) that prevents a bipolar transistor from entering saturation. It, too, uses a separately biased unit to make the comparison, though it does not operate a binary mode switch, like the circuit of Chang et al. Finally, U.S. Pat. No. 5,381,054 shows a compact multiple-input comparator circuit, but it does not clip any analog output level.

Thus, it would be thus be desirable to have an OTA circuit whose output voltage is clamped, without requiring significant additional circuit area and power, and which has a sharp knee.

SUMMARY OF THE INVENTION

In general, the present invention is an operational trans-conductance amplifier having a voltage clamp circuit. The clamp circuit utilizes low area and power overhead, has a sharp clamp characteristic, and little degradation in the small-signal DC gain at the "knee" of the clamp characteristic. The clamp circuit includes a comparator circuit and a current control circuit. The amplifier and clamp circuits may further include a clamp voltage generator circuit.

According to a first embodiment of the present invention, the circuit comprises a folded cascode operational trans-conductance amplifier circuit, and a clamp circuit connected to the trans-conductance amplifier circuit, the clamp circuit comprising, a comparator circuit, and a current control circuit connected to the comparator circuit. The trans-conductance amplifier circuit comprises a differential input stage, a folded cascode circuit connected to the differential input stage, and a current mirror circuit connected to the folded cascode circuit. The comparator circuit comprises a first transistor connected to the folded cascode circuit, and a second transistor connected between the first transistor and an output node. The current control circuit comprises a third transistor connected to the folded cased circuit, the output node and a node between the first and second transistors. The current control circuit may further comprise a fourth transistor connected to the third transistor and a node between the first and second transistors. The first transistor provides a reference current to which the second transistor's current is compared.

In an alternate implementation, the comparator circuit comprises a first transistor connected to an output node, and a second transistor connected between the first transistor and the current mirror circuit. The current control circuit comprises a third transistor connected to the output node and a node on a left branch between the folded cascode circuit and the current mirror circuit. The current control circuit further comprises a fourth transistor connected to the third transistor and a node between the first and second transistors.

The folded-cascode circuit may comprise N-type MOSFETs, and the mirror cascode circuit may comprise P-type MOSFETs.

According to another embodiment, a circuit according to the present invention may comprise a pair of transistors forming a differential input stage, a first set of four transistors forming a folded cascode circuit, wherein one transistor of the pair of differential input stage transistors is connected to a first node of the folded cascode circuit, and a second transistor of the pair of differential input stage transistors is connected to a second node of the of folded cascode circuit, a current mirror circuit connected to the folded cascode circuit, and a clamp circuit, the clamp circuit comprising, a first comparator transistor having a source connected to the second node of the folded cascode circuit, and a gate connected to a biasing node in the folded cascode circuit, a second comparator transistor having a drain connected to a drain of the first comparator transistor, a gate connected to a clamp voltage, and a source connected to an output node, and a third transistor having a source connected to the first node of the folded cascode circuit, a drain connected to the output node, and a gate connected to the drain of the second comparator transistor. The clamp circuit further comprises a fourth transistor having a source connected to the source of the third transistor, and a drain and gate connected to the gate of the third transistor and the drain of the second comparator transistor. The circuit may further comprise a transistor connected to the sources of the differential input pair of transistors.

Additionally, the circuit may further comprise a clamp voltage generator circuit connected to the gate of the second comparator transistor. The clamp voltage generator circuit may be implemented in several different ways. The clamp voltage generator circuit may comprise a first clamp generator transistor having a source connected to the first node of the folded cascode circuit, a second clamp generator transistor having a drain and gate connected to the gate of the second comparator transistor, and a source connected to a node of a transistor in the current mirror circuit. According to another variation, the clamp voltage generator circuit may comprise a first clamp generator transistor having a source connected to the first node of the folded cascode circuit, and a second clamp generator transistor having a drain and gate connected to the gate of the second comparator transistor, and a source connected to a third node of a transistor in the mirror cascode circuit. According to a third variation, the clamp voltage generator circuit comprises a first clamp generator transistor having a source connected to the first node of the folded cascode circuit, and a second clamp generator transistor having a drain and gate connected to the gate of the second comparator transistor, and a source connected to an external control voltage.

According to an implementation of the present invention, a circuit comprises a folded cascode operational trans-conductance amplifier circuit, comprising a differential input stage, a folded cascode circuit connected to the differential input stage, and a mirror cascode circuit connected to the folded cascode circuit, and a clamp circuit connected to the trans-conductance amplifier circuit, the clamp circuit comprising a comparator circuit, which comprises a first transistor connected to the mirror cascode circuit, and a second transistor connected to between the first transistor and an output node, the output node connected to a second branch connecting the folded cascode circuit and the mirror cascode circuit, and a current control circuit comprising a third transistor connected to the output node, and a node of a first branch connecting the folded cascode circuit and the mirror cascode circuit. The current control circuit may further comprise a fourth transistor connected to the third transistor and a node between the first and second transistors.

The circuit may further comprise a clamp voltage generator circuit connected to the gate of the second comparator transistor. The clamp voltage generator circuit comprises a first clamp generator transistor having a gate and drain connected to the gate of the second comparator transistor and a source connected to a control voltage, and a second clamp generator transistor having a drain connected to the gate and drain of the first clamp generator transistor, a source connected to the mirror cascode circuit, and a gate connected to a bias voltage.

According to another embodiment of the present invention, a circuit comprises a signal input stage, comprising a differential input stage, and a mirror cascode circuit connected to the differential input stage, and a clamp circuit connected to the input stage and mirror cascode circuit, the clamp circuit comprising a comparator circuit comprising a first transistor connected to the mirror cascode circuit, and a second transistor connected to the first transistor and an output node, the output node connected to a second branch connecting the input stage and the mirror cascode circuit, and a current control circuit comprising a third transistor connected to the output node, and a node of a first branch connecting the input stage and the mirror cascode circuit. The circuit may further comprise a fourth transistor connected to the third transistor and a node between the first and second transistors.

In one embodiment of the present invention, the circuit comprises a pair of transistors forming a differential input stage, a first set of four transistors forming a folded cascode circuit, wherein one transistor of the pair of differential input stage transistors is connected to a first node of the folded cascode circuit, and a second transistor of the pair of differential input stage transistors is connected to a second node of the of folded cascode circuit, a second set of four transistors forming a mirror cascode circuit connected to the folded cascode circuit, and a clamp circuit, the clamp circuit comprising a first comparator transistor having a source connected to the output node, and a gate connected to a clamp voltage, a second comparator transistor having a drain connected to a drain of the first comparator transistor, a gate connected to a biasing voltage, and a source connected to a node in the mirror cascode circuit, and a third transistor having a drain connected to the output node, and a source to a node of one branch connecting the folded cascode circuit and the mirror cascode circuit. The clamp circuit may further comprise a fourth transistor having a drain and gate connected to a drain of the first comparator transistor, and a source connected to a source of the third transistor. The circuit may further comprise a clamp voltage generator circuit connected to the gate of the second comparator transistor. The clamp voltage generator circuit comprises a first clamp generator transistor having a gate and drain connected to the gate of the second comparator transistor and a source connected to a control voltage, and a second clamp generator transistor having a drain connected to the gate and drain of the first clamp generator transistor, a source connected to the mirror cascode circuit, and a gate connected to a bias voltage.

As described herein, the present invention may be implemented in different circuit embodiments and variations. Specifically, while certain embodiments disclose using a folded cascode stage, as disclosed in another embodiment, a differential input stage may be utilized. Also, while a four transistor current mirror circuit is specifically described, the current mirror may be implemented as a simple two transistor current mirror. In addition, the clamp circuit may be utilized to either clamp how high the output voltage can go, or clamp how low the voltage can go. Furthermore, several variations are disclosed to implement a clamp voltage generator circuit, in combination with variations of the above-noted circuits.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

Figure 1:
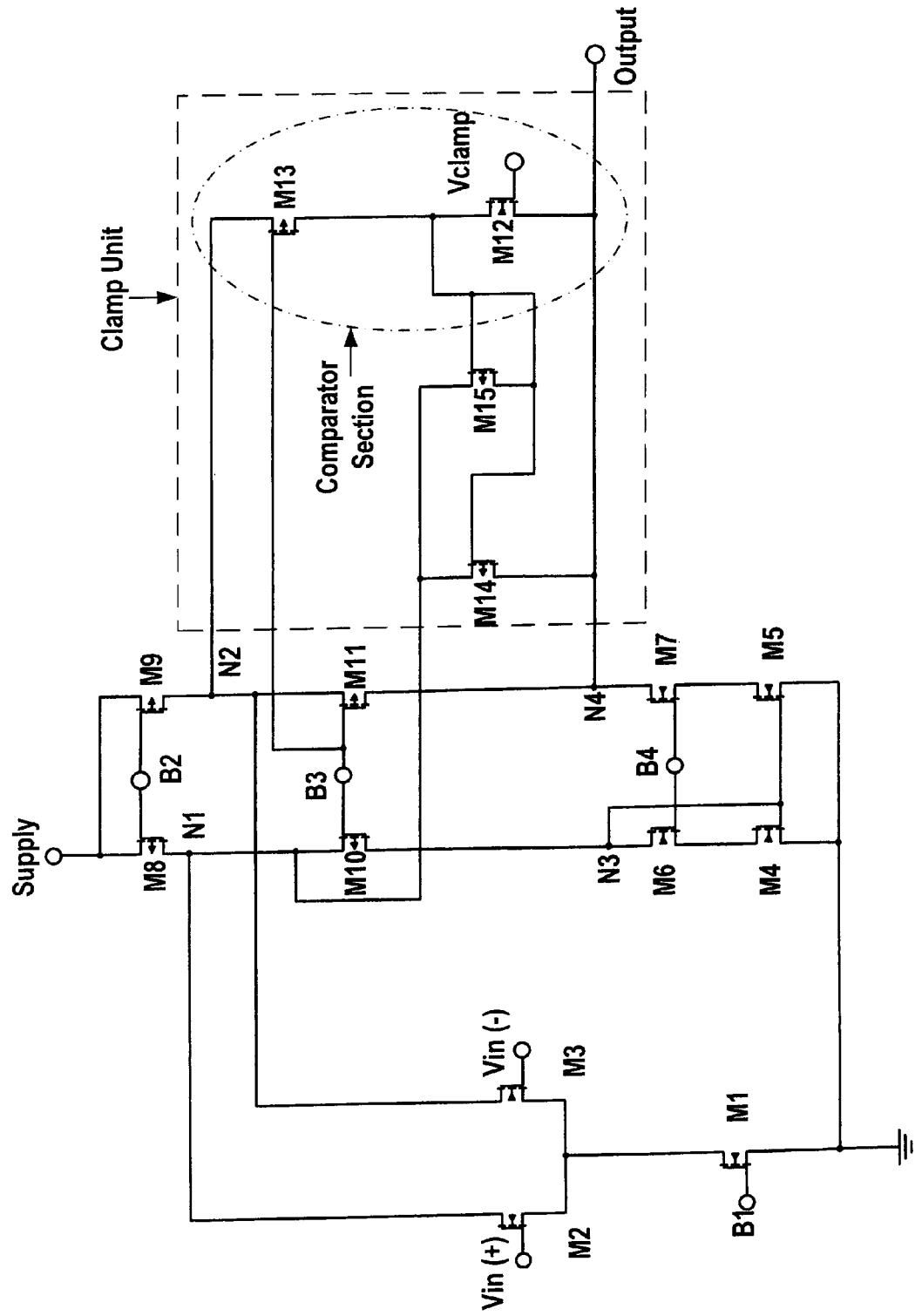
FIG. 1 is a schematic diagram of one embodiment of an operational trans-conductance amplifier having an output clamp circuit according to the present invention.

A schematic of an embodiment of circuit according to the present invention is shown in FIG. 1. As disclosed herein, this circuit can clamp the output of an OTA with these advantages: (a) very low area and power overhead; (b) a sharp clamp characteristic; and (c) virtually no degradation in the small-signal DC gain at the "knee" of the voltage clamp characteristic. The latter advantage is very important for feedback amplifiers with high closed-loop gains. These three advantages make the disclosed invention particularly well suited for gain amplifiers with feedback, such as the widely-used switched capacitor class. Clamp circuits of the prior art do not provide all of these advantages at once.

FIG. 1 illustrates a standard NFET input folded-cascode operational trans-conductance amplifier (OTA) circuit, consisting of transistors M1 through M11, and biased by bias voltages B1-B4. The circuit is implemented in standard CMOS VLSI, with enhancement-mode NFETs and PFETs. The differential input transistors M1, M2 are connected to the folded-cascode at nodes N1, N2, respectively. Transistors M8-M11 form a folded cascode circuit, and transistors M4-M7 form a mirror cascode circuit. The folded cascode transistors M8-M11 comprise P-type MOSFETs, and the mirror cascode transistors M4-M7 comprise N-type MOSFETs. An Output node is connected to node N4, between the folded and mirror cascode circuits. A node on the left branch between the folded cascode and mirror cascode circuits connects to the gates of M4 and M5 (node N3). Transistor M1 is connected between the differential input pair (M2, M3) and ground, and is biased by bias voltage B1 connected to its gate. Bias voltages B2, B3, and B4 are applied to the gates of the M8/M9 pair, M10/M11 pair, and M6/M7 pair respectively.

The OTA circuit is connected to a clamp circuit consisting of transistors M12 through M15. Devices M12 and M13 form a comparator. Devices M14 and M15 implement a ratioed current mirror that limits the output voltage when the comparator trips a lower limit. M13 is connected in parallel with cascode device M11. M13 thus provides a reference current against which M12's current is compared. Typically M13 is sized much smaller than M11. When the Output node voltage falls below a limit, M12 sinks current in excess of M13's current, turning on M14, and thereby clamping the output voltage. This embodiment of the clamp circuit prevents the output voltage from falling below a level set by the clamp reference voltage Vclamp, even if the resultant differential input signal, Vin(+) minus Vin(−), is significantly negative. In other words, the clamp circuit limits how low the Output voltage can go.

In further detail, the differential input pair M2, M3 is connected to nodes N1, N2, respectively, in the folded cascode circuit M8-M11. The mirror cascode circuit M4-M7 is connected to the folded cascode circuit M8-M11. The source of M13 is connected to node N2, its gate is connected to bias voltage B3 (gates of M10, M11), and its drain is connected to the drain of M12. The gate of M12 is connected to the clamp voltage Vclamp, and its source is connected to the Output node (node N4). These two transistors, M13, M12, form the comparator section of the clamp circuit. M14 has its source connected to node N1, its drain connected to the Output node (node N4), and its gate is connected to the drain of M12. Optional transistor M15 has its source connected to the source of M14, its drain connected to the gate of M14, and its gate connected to the gate of M14 and the drain of M12. Transistors M14, M15 together form a current mirror, which generally is a "ratioed current mirror" in that the gain is not unity, but this is not strictly required. As described herein, circuits including M14 alone, or both M14 and M15 will be referred to as a "current control circuit."

While shown as a folded mirror circuit (M4-M7), the mirror circuit could also be formed as a simple two transistor current mirror.

The clamp circuit M12-M15 operates as follows. PFET M13, which is arranged in parallel with cascode device M11, is a relatively small device which can source current to the drain of M12. Generally M12 is cut off, as the output voltage is higher than the desired low limit. But if the output voltage were to fall, say gradually for the sake of illustration, at some point M12 will turn on, and the gate voltage of M14 will fall. Then M14 will pull current away from the left source branch (node N1), reducing the sinking mirror current in M7, as well as providing source current to the output node. Here, M15 acts as a degenerating device, which can improve the DC and transient characteristics of the circuit; but in general it is optional, and a particular implementation of the present invention may not include it.

Note that the clamp trip point occurs when the currents through M12 and M13 are equal, and both devices are in saturation. By using a device in parallel with a cascode branch to generate the reference, the current through M13 gets cancelled by the M12 current, whenever M14/M15 remain cut off. This means that if the Output voltage is very close to the clamp threshold, i.e. just above the "knee," the conductance of M12 does not significantly degrade the normally high output resistance of the OTA. Hence, the small-signal DC gain of the OTA remains very high, and no input-referred DC offset occurs at or near the knee. Furthermore, even though the M13 current gets perturbed by the input overdrive (i.e. the amount below the knee point), which could affect the threshold, this gets cancelled by the action of the M14/M15 mirror, if ratioed the same as M11/M13. The size ratio between M14 and M15 is a key parameter that determines the sharpness, and can be set according to the desired clamp operation.

Figure 2:
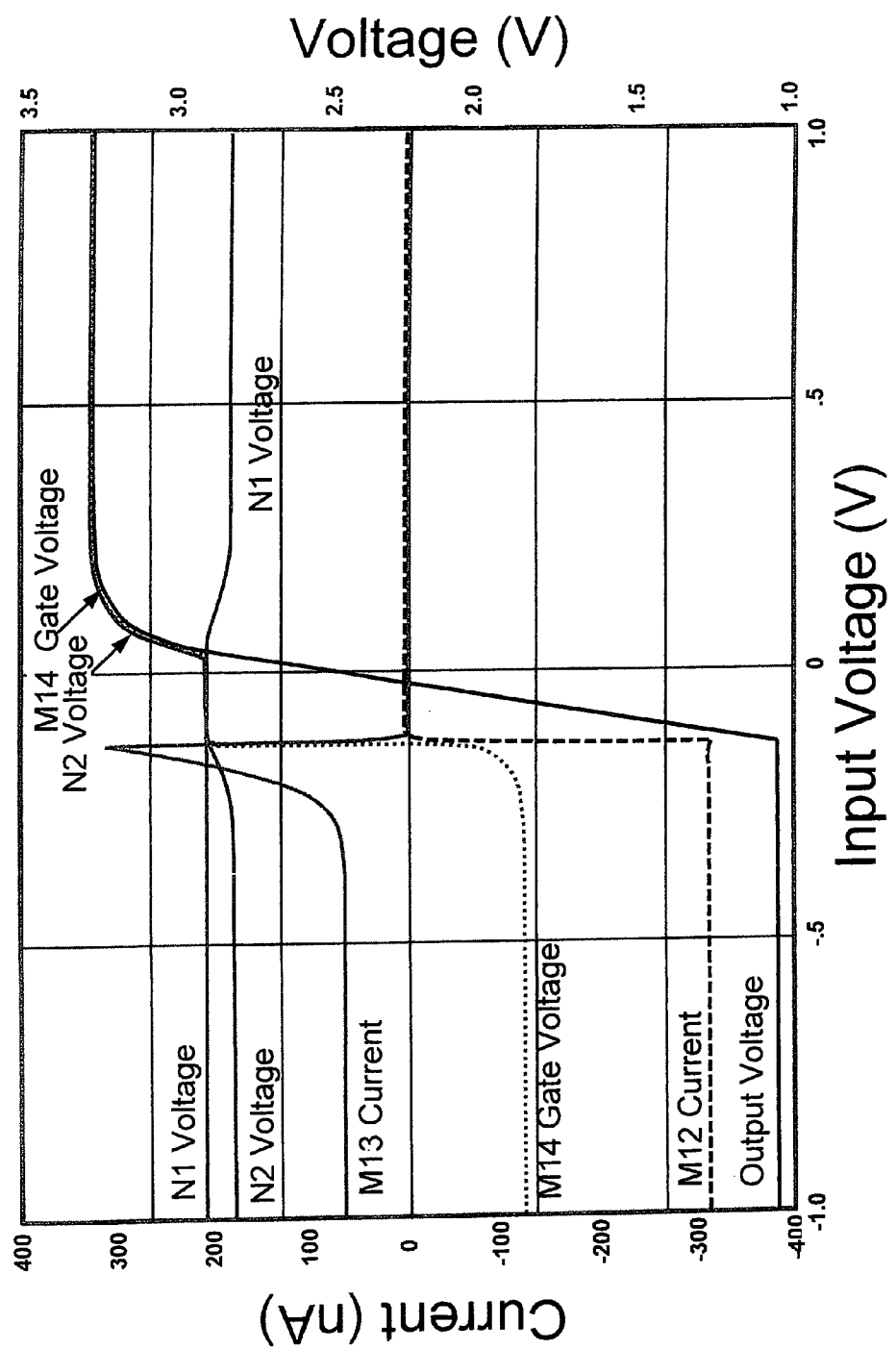
FIG. 2 is a graph of certain currents and voltages of the circuit of FIG. 1.

FIG. 2 is a graph illustrating the operation of the circuit of FIG. 1, using a simulation example, in a non-inverting feedback configuration with a closed-loop gain of 11. The output voltage is plotted as a function of the amplifier input. In addition, the voltages at the comparator output node (M12 drain or M14 gate) and folded cascode nodes, and the currents through M12 and M13, are shown. Note how the cascode voltages are equal over the linear portion of the output characteristic, but diverge with increasing negative input (overdrive) over the plateau region. The M13 current is also varying with the overdrive in the plateau region. But the M12 current remains constant, as M15 compensates for the variation in the M13 current.

Figure 3:
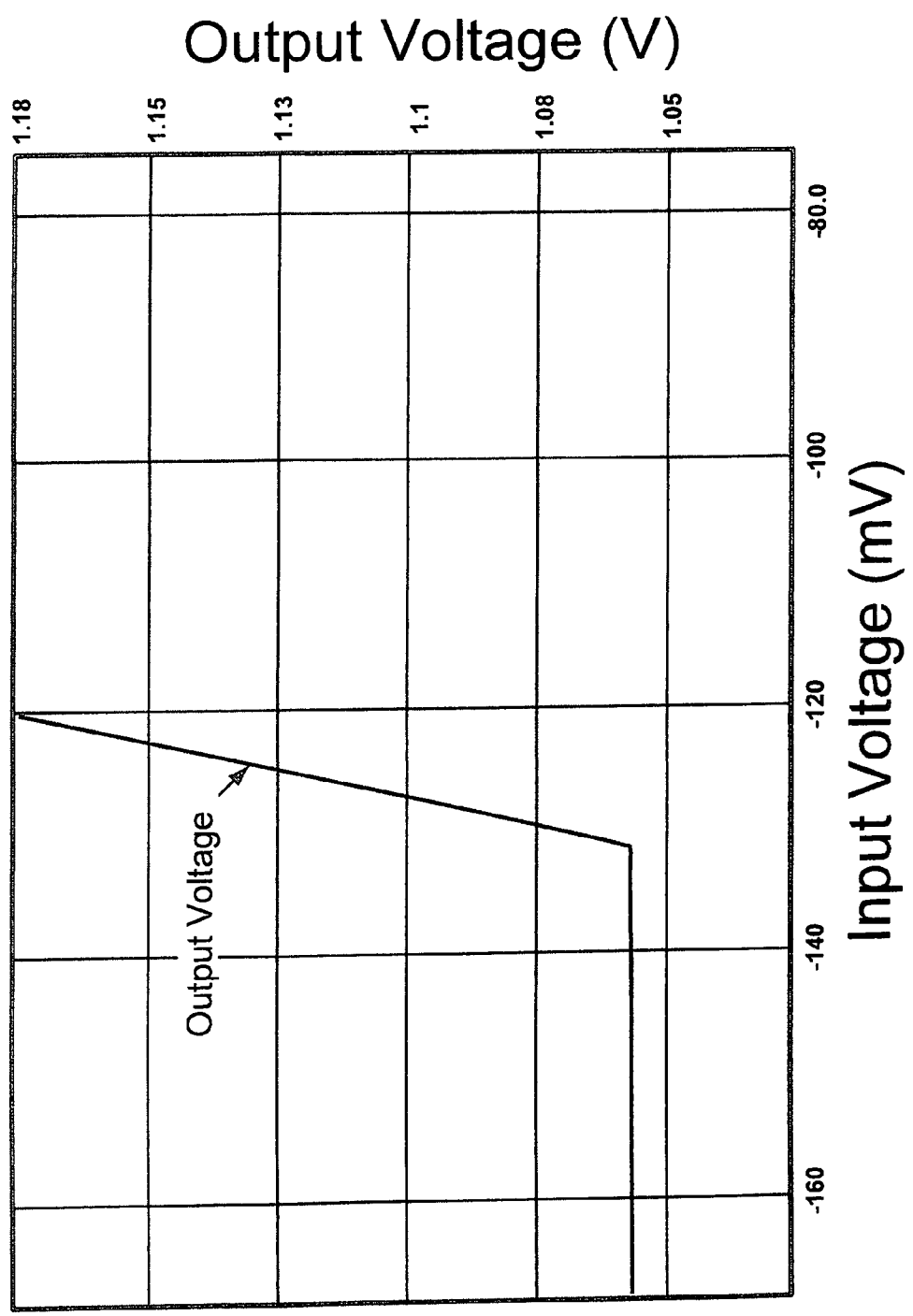
FIG. 3 is a graph of the circuit response of FIG. 1 around the "knee"

FIG. 3 is a graph of a zoomed in view of FIG. 2 around the "knee." Note sharpness of the knee.

Figure 4:
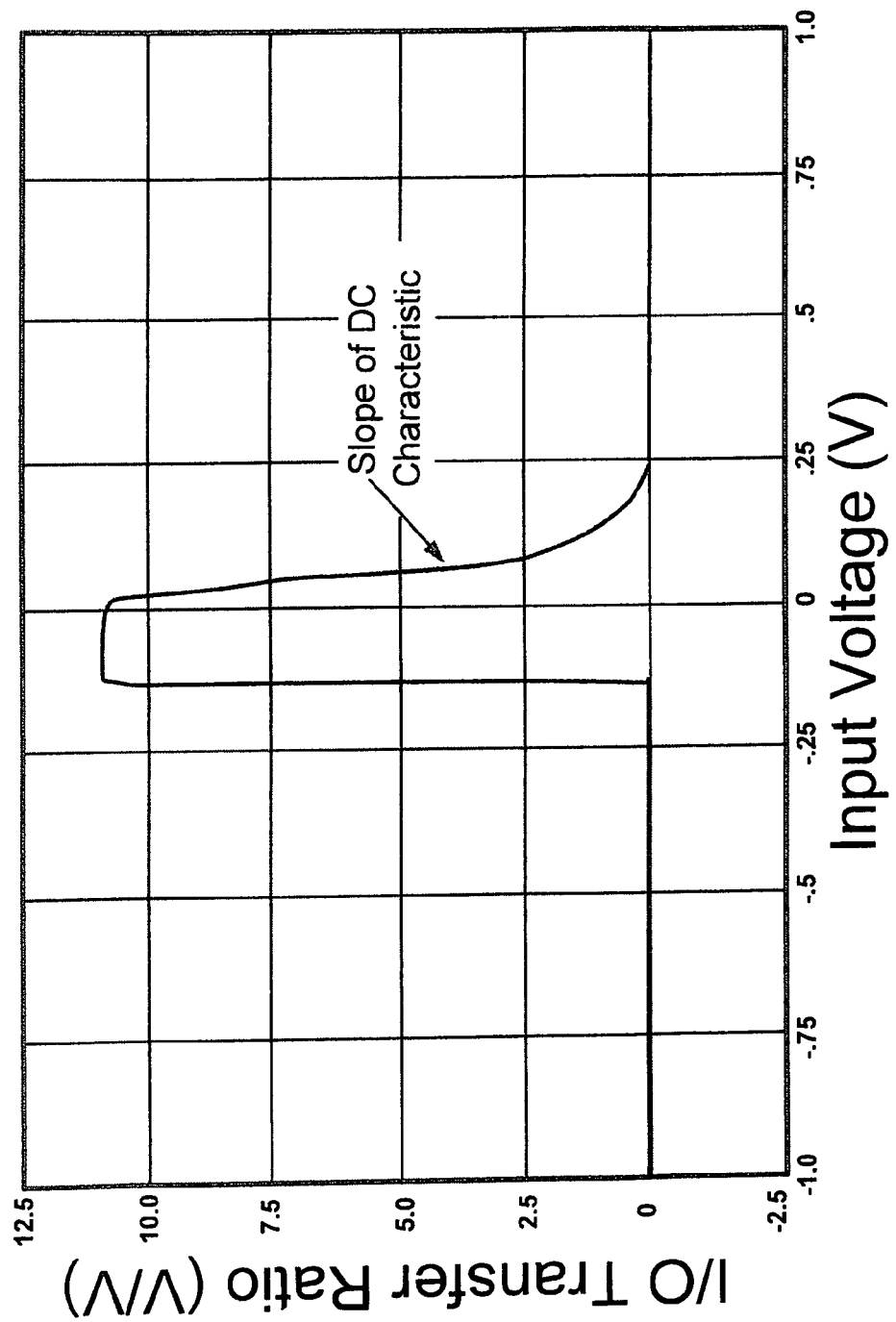
FIG. 4 is a graph of the slope of the output characteristics of the circuit of FIG. 1.

FIG. 4 is a graph showing the slope of the output characteristic, providing another illustration of the clamp performance.

Figure 5:
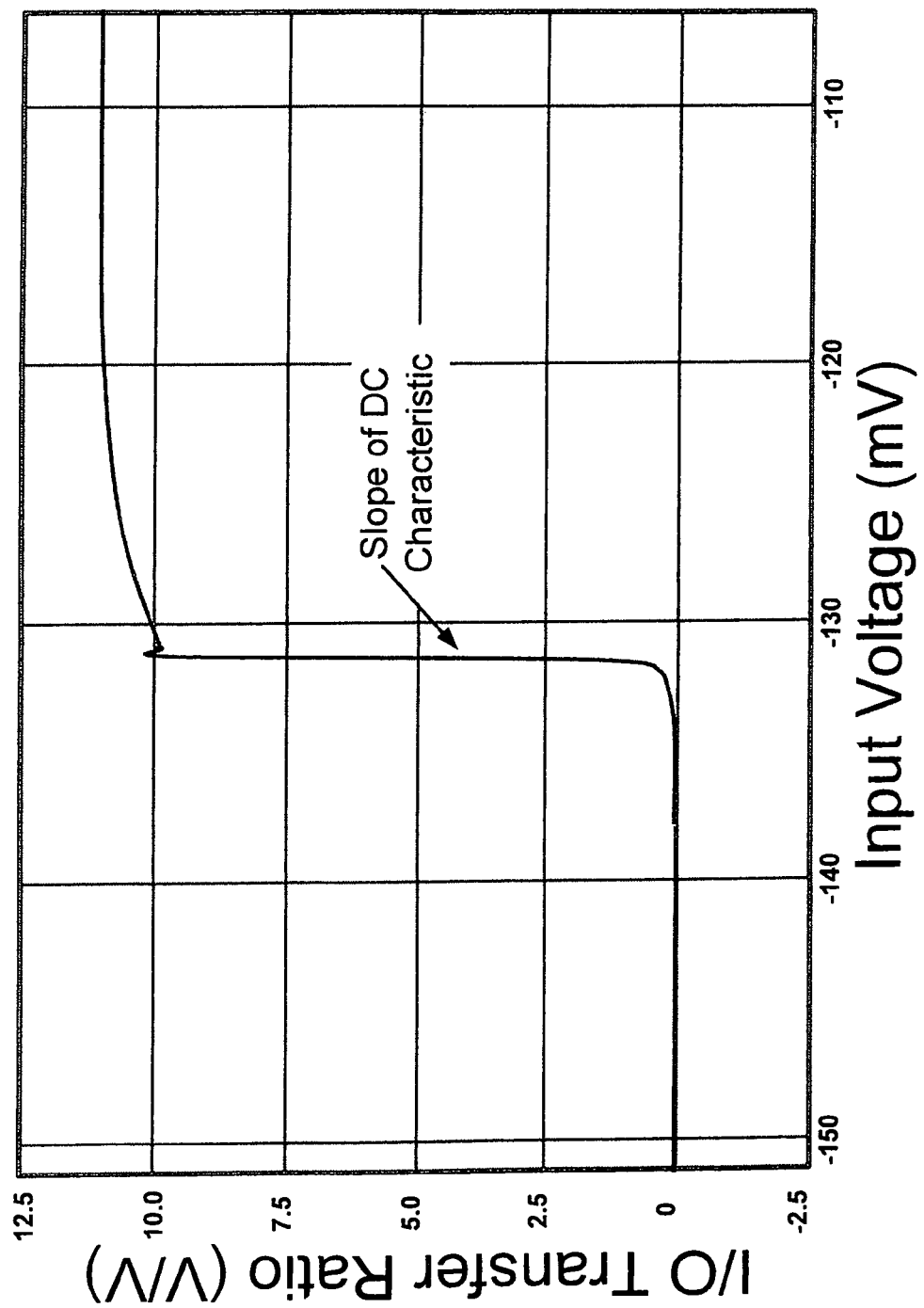
FIG. 5 is a graph of a the slope around the "knee" in FIG. 4.

FIG. 5 is graph of a zoomed in view of the slope around the knee. The slight slope roll-off before the knee (i.e. to the right) is due to the perturbation of the M3 input device current with the M13 current.

Note that the slope of the clamp plateau is determined by the M14/M15 mirror pair; i.e., the linearity and matching to the M11/M13 ratio. Also, as noted above, some embodiments may omit M15, depending on the application, but M15 helps control ringing during a transient (without M15, the plateau will bend upward towards the left).

The power overhead of the circuit depends on the M11/M13 ratio, which trades off with speed. At higher closed-loop gains, relative clamp speed can be maintained at more frugal ratios. The supply current also remains constant, even when the clamp is actively limiting. In imaging devices, with arrays of such units, the supply bus will not cause cross-talk artifacts. No DC buffering is required for Vclamp, further reducing circuit complexity.

Figure 6:
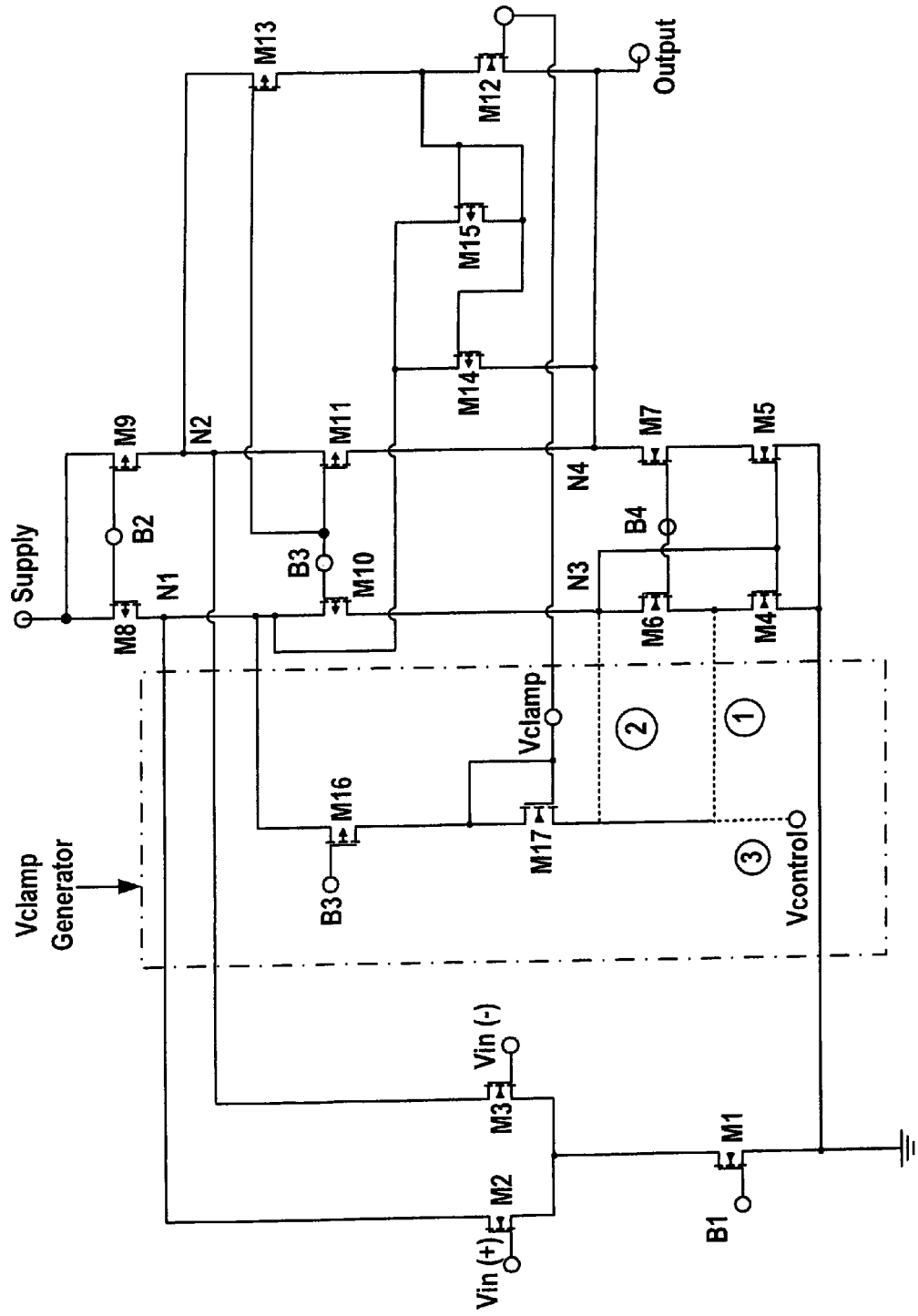
FIG. 6 is a schematic of an alternative embodiment of a circuit according to the present invention.

An alternative embodiment of the present invention is illustrated in FIG. 6. In this embodiment, the Vclamp voltage is generated internally by a Vclamp generator circuit comprising M16 and M17, which is a balanced replica of M13 and M12, respectively. The source of M16 is connected to node N1, and the drain of M16 is connected to the drain and gate of M17. The gate of M17 is further connected to the gate of M12 (in place of the Vclamp reference voltage of the embodiment of FIG. 1).

The source of M17 can be connected in any one of the three variations shown to receive the current. In variation 1, the current returns to the source of N cascode M6, so that the clamp threshold can be adjusted by the B4 bias voltage. In variation 2, the current returns to the drain of M6 (node N3), resulting in a fixed threshold. Finally, according to variation 3, the current returns to an external source, Vcontrol.

The resulting Vclamp level is, systematically, identical to the source voltage of M17. This helps cancel device variations, especially those that appear in a large array of units, as is typical in imaging devices. In variation 1, the cascode bias voltage B4 also serves as a threshold adjustment. In variation 3, the Vcontrol level matches the clamp threshold—there is no need to level-shift the Vclamp level to compensate for the gate-to-source drop of M12. The current out of the Vcontrol node is constant if the M14/M15 to M11/M13 sizing conditions noted above are met, resulting in a minimal buffering burden.

In variation 2, though the clamp level is fixed, it does not require managing any bias. In both the embodiments shown in FIGS. 1 and 6, capacitance is added to the right cascode branch (node N4) by M13 and other elements associated with the comparator (M12/M13). For AC balance, a small capacitor, such as a PFET, can be added between the bias voltage node B3 and the left cascode node N1. The value of the capacitance would be less in the circuit of FIG. 6; it is still appropriate for balance because M13 is in the ohmic region, but M16 is in saturation.

Also, the DC balance in variation 3 can be maintained by perturbing the gain of mirror M4-M7, along with the M10/M11 sizings if desired. In the embodiment of FIG. 1, the cascode mirror M4-M7 can be replaced by a simple current mirror or other mirroring device. This is also true for variations 2 and 3 of the embodiment of FIG. 6.

Figure 7:
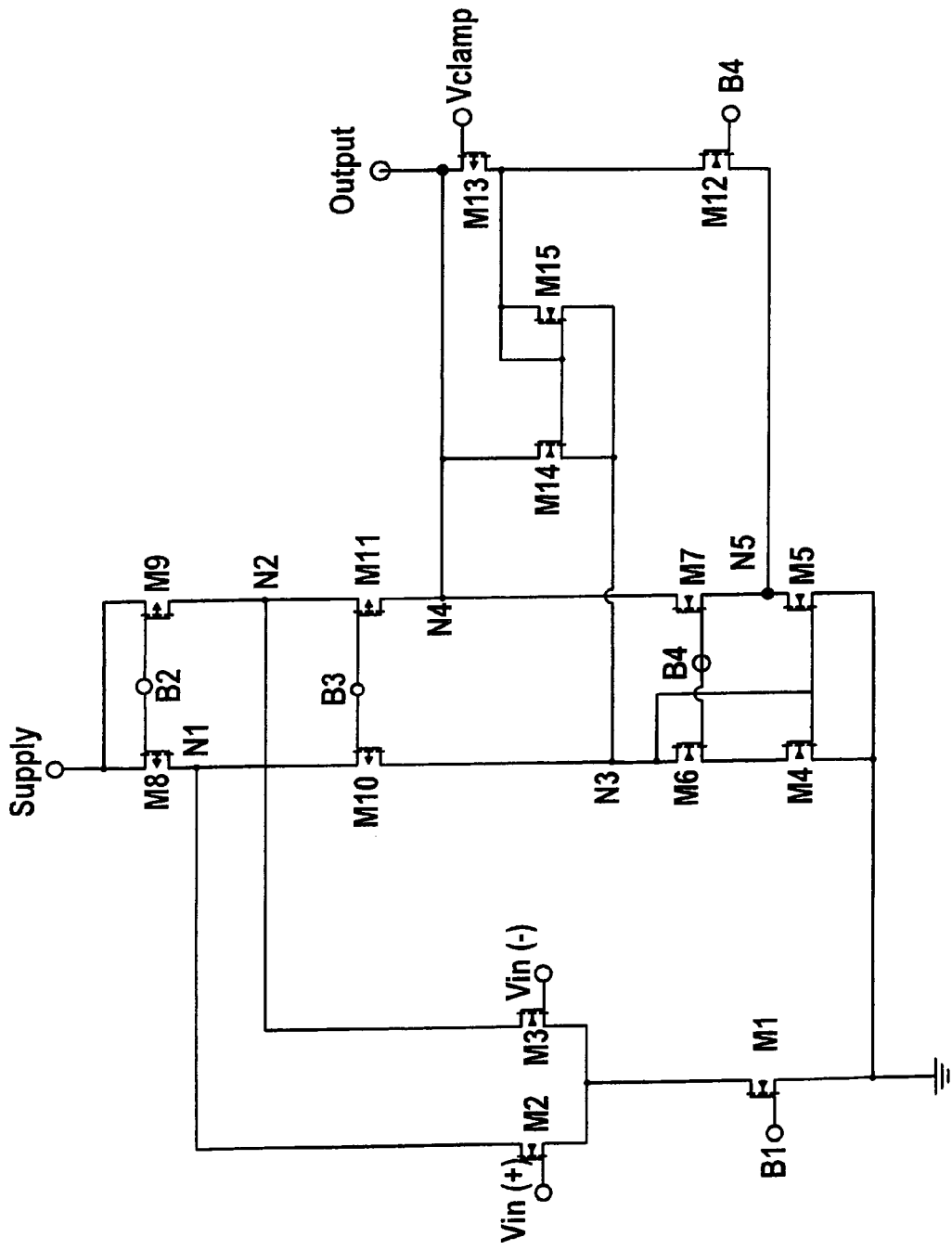
FIG. 7 is a schematic of an additional alternative embodiment of a circuit according to the present invention.

Another alternate embodiment of the present invention is shown in FIG. 7. This design keeps the same OTA polarity as shown in FIG. 1—an NFET input and a PFET folded cascode. The concept is the same as the circuit in FIG. 1, except that this embodiment uses the bottom mirror cascode instead of the top folded cascode(s). This construction limits how high the Output voltage can go, instead of how low. The clamp plateau is flat when M15 is omitted. This is different from the FIG. 1 embodiment.

Specifically, the Output node is again connected to node N4. However, the source of M13 (still a PFET) is now connected to the Output node, the drain of M13 to the drain of M12 (still an NFET) and the gate of M13 to the Vclamp reference voltage. The source of M12 is now connected to node N5 (the node between M7 and M5 in the mirror cascode). Transistors M14 and M15 are now NFETs. The drain of M14 is connected to the Output node, and the source of M14 is connected to node N3. The gate of M14 is connected to the gate of M15 and the drain of M13. The source of M15 is connected to the source of M14 (and node N3). The drain of M15 is connected to its gate and to the drain of M13. A bias voltage B4 is applied to the gate of M12, which is the same as that applied to the gates of devices M6 and M7.

Figure 8:
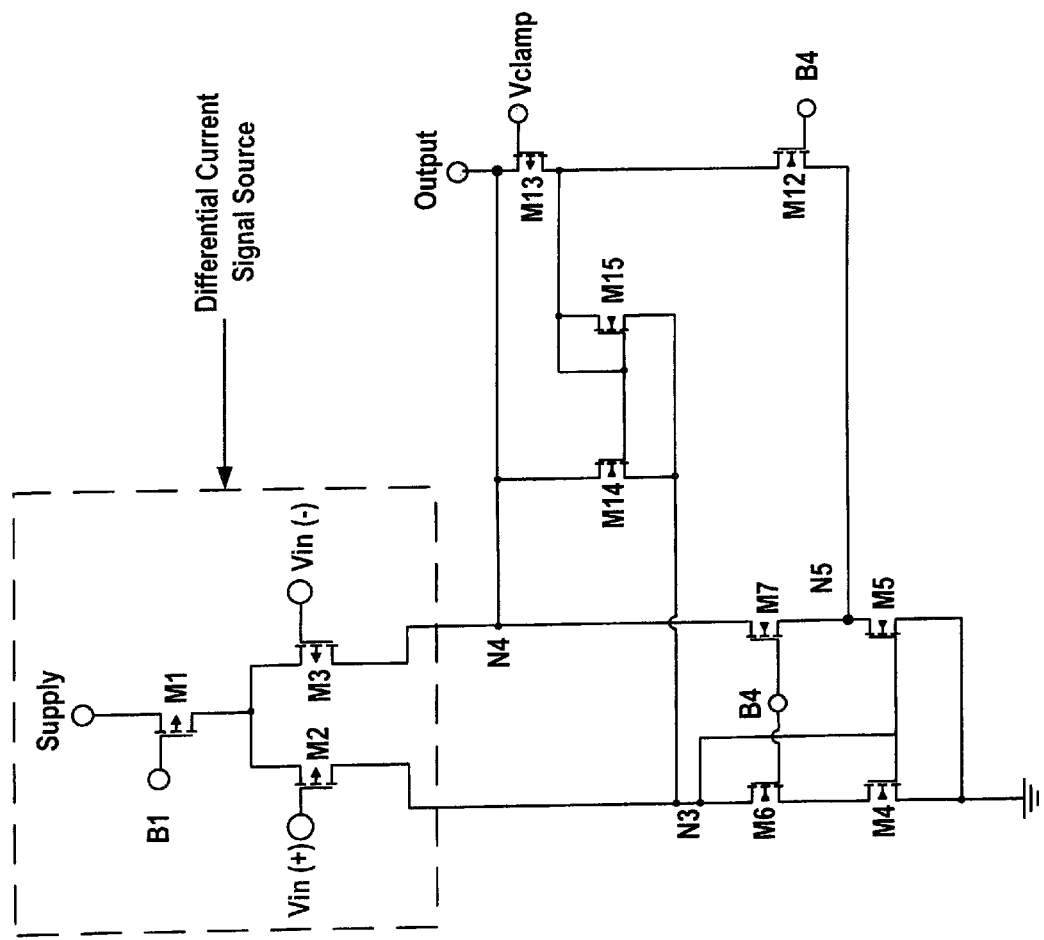
FIG. 8 is a schematic of a second additional alternative embodiment of a circuit according to the present invention.

The embodiment of FIG. 7 does not require the use of a folded cascode circuit M8-M11. Any technique for conveying a differential input signal with an appropriate DC bias can be used. For example, as shown in FIG. 8, the folded cascode circuit is omitted, and the output of a PFET differential pair is applied directly to nodes N3 and N4. Any similar circuit that provides a differential current signal (with an appropriate DC common-mode) into the nodes N3 and N4 will work.

Figure 9:
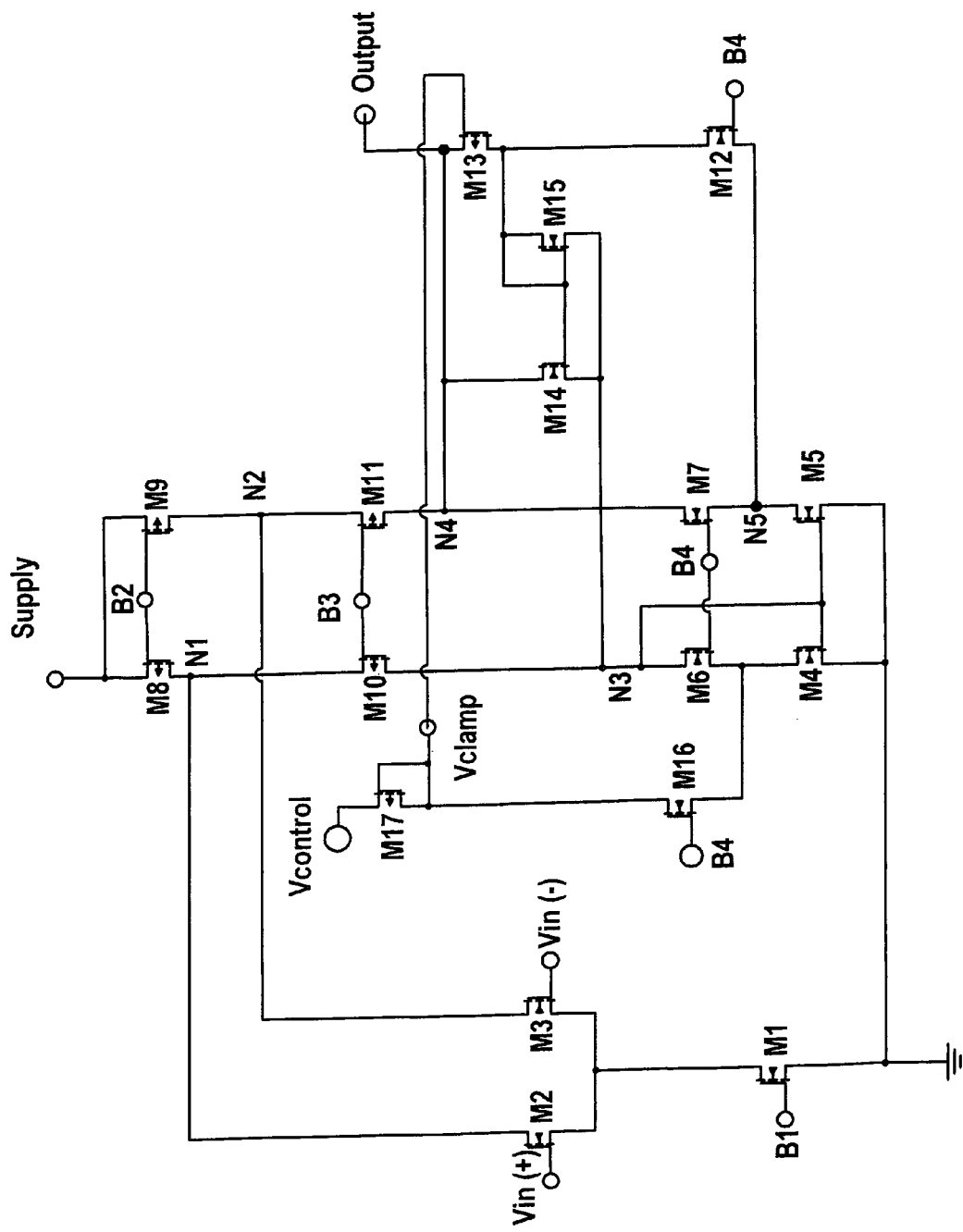
FIG. 9 is a schematic of a third additional alternative embodiment of a circuit according to the present invention.

FIG. 9 illustrates an additional variation of the circuit of FIG. 7. Specifically, a Vclamp generator circuit, comprising NFET M16 and PFET M17, has been added. The Vcontrol node sets the clamp threshold with no systematic offset (like the circuit of FIG. 6, variation 3). The gate of M16 is connected to bias B4, the cascode bias for the mirror. M16 provides a reference current that feeds into diode connected M17.

One design consideration with the schemes presented herein involves the cutoff of M14 when the clamp is not actively limiting the output. For the circuits of FIGS. 1 and 6, M14 will see the difference between the N1 and N2 cascode node voltages, which generally should be maintained below its threshold (e.g. during a transient) unless it can be verified that its effect is not significant. This can be confirmed with circuit simulations, which can include transient analysis. Also, in the circuit of FIG. 7, M14 sees the difference between nodes N3 and N5.

Various combinations of the above embodiments are possible; e.g., combining upper and lower clamps, with the different variations of the Vclamp generator circuit.

Those skilled in the art will appreciate that various adaptations and modifications of the just described preferred embodiments can be configured without departing from the scope and spirit of the invention. Therefore, it is to be understood that, within the scope of the appended claims, the invention may be practiced other than as specifically described herein.

What is claimed is:

1. A circuit comprising:
   a folded cascode operational trans-conductance amplifier circuit, comprising:
      a differential input stage;
      a folded cascode circuit connected to the differential input stage; and
      a current mirror circuit connected to the folded cascode circuit;
   and
   a clamp circuit connected to the trans-conductance amplifier circuit, the clamp circuit comprising:
      a comparator circuit, comprising:
         a first transistor connected to the folded cascode circuit; and
         a second transistor connected between the first transistor and an output node;
      and
      a current control circuit connected to the comparator circuit, comprising:
         a third transistor connected to the folded cased circuit, the output node and a node between the first and second transistors.

2. The circuit of claim 1, wherein the current control circuit further comprises a fourth transistor connected to the third transistor and a node between the first and second transistors.

3. The circuit of claim 2, wherein the first transistor provides a reference current to which the second transistor's current is compared.

4. The circuit of claim 3, wherein the current control circuit sets a lower limit on an output voltage at an output node.

5. A circuit comprising:
   a folded cascode operational trans-conductance amplifier circuit, comprising:

a differential input stage;
a folded cascode circuit connected to the differential input stage; and
a current mirror circuit connected to the folded cascode circuit;
and
a clamp circuit connected to the trans-conductance amplifier circuit, the clamp circuit comprising:
a comparator circuit, comprising:
a first transistor connected to an output node; and
a second transistor connected between the first transistor and the current mirror circuit;
and
a current control circuit connected to the comparator circuit, the current control circuit comprising:
a third transistor connected to the output node and a node on a left branch between the folded cascode circuit and the current mirror circuit.

6. The circuit of claim 5, wherein the current control circuit further comprises a fourth transistor connected to the third transistor and a node between the first and second transistors.

7. The circuit of claim 1, wherein the folded-cascode circuit comprises N-type MOSFETs, and the mirror cascode circuit comprises P-type MOSFETs.

8. A circuit comprising:
a pair of transistors forming a differential input stage;
a first set of four transistors forming a folded cascode circuit, wherein one transistor of the pair of differential input stage transistors is connected to a first node of the folded cascode circuit, and a second transistor of the pair of differential input stage transistors is connected to a second node of the folded cascode circuit;
a current mirror circuit connected to the folded cascode circuit; and
a clamp circuit, the clamp circuit comprising:
a first comparator transistor having a source connected to the second node of the folded cascode circuit, and a gate connected to a biasing node in the folded cascode circuit;
a second comparator transistor having a drain connected to a drain of the first comparator transistor, a gate connected to a clamp voltage, and a source connected to an output node; and
a third transistor having a source connected to the first node of the folded cascode circuit, a drain connected to the output node, and a gate connected to the drain of the second comparator transistor.

9. The circuit of claim 8, wherein the clamp circuit further comprises a fourth transistor having a source connected to the source of the third transistor, and a drain and gate connected to the gate of the third transistor and the drain of the second comparator transistor.

10. The circuit of claim 9, further comprising a transistor connected to the sources of the differential input pair of transistors.

11. The circuit of claim 10, further comprising a clamp voltage generator circuit connected to the gate of the second comparator transistor.

12. The circuit of claim 11, wherein the clamp voltage generator circuit comprises:
a first clamp generator transistor having a source connected to the first node of the folded cascode circuit; and
a second clamp generator transistor having a drain and gate connected to the gate of the second comparator transistor, and a source connected to a node of a transistor in the current mirror circuit.

13. The circuit of claim 11, wherein the clamp voltage generator circuit comprises:
a first clamp generator transistor having a source connected to the first node of the folded cascode circuit; and
a second clamp generator transistor having a drain and gate connected to the gate of the second comparator transistor, and a source connected to a third node of a transistor in the mirror cascode circuit.

14. The circuit of claim 11, wherein the clamp voltage generator circuit comprises:
a first clamp generator transistor having a source connected to the first node of the folded cascode circuit; and
a second clamp generator transistor having a drain and gate connected to the gate of the second comparator transistor, and a source connected to an external control voltage.

15. A circuit comprising:
a folded cascode operational trans-conductance amplifier circuit, comprising:
a differential input stage;
a folded cascode circuit connected to the differential input stage; and
a mirror cascode circuit connected to the folded cascode circuit;
and
a clamp circuit connected to the trans-conductance amplifier circuit, the clamp circuit comprising:
a comparator circuit comprising:
a first transistor connected to the mirror cascode circuit; and
a second transistor connected to the first transistor and an output node, the output node connected to a second branch connecting the folded cascode circuit and the mirror cascode circuit;
and
a current control circuit comprising:
a third transistor connected to the output node, and a node of a first branch connecting the folded cascode circuit and the mirror cascode circuit.

16. The circuit of claim 15, wherein the current control circuit further comprises a fourth transistor connected to the third transistor and a node between the first and second transistors.

17. The circuit of claim 15, further comprising a clamp voltage generator circuit connected to the gate of the second comparator transistor.

18. The circuit of claim 15, wherein the clamp voltage generator circuit comprises:
a first clamp generator transistor having a gate and drain connected to the gate of the second comparator transistor and a source connected to a control voltage; and
a second clamp generator transistor having a drain connected to the gate and drain of the first clamp generator transistor, a source connected to the mirror cascode circuit, and a gate connected to a bias voltage.

19. A circuit comprising:
a signal input stage, comprising:
a differential input stage; and
a mirror cascode circuit connected to the differential input stage;
and
a clamp circuit connected to input stage and mirror cascode circuit, the clamp circuit comprising:
a comparator circuit comprising:
a first transistor connected to the mirror cascode circuit; and a second transistor connected to the first transistor and an output node, the output node connected to a second branch connecting the input stage and the mirror cascode circuit; and a current control circuit comprising:
a third transistor connected to the output node, and a node of a first branch connecting the input stage and the mirror cascode circuit.

20. The circuit of claim 19, further comprising a fourth transistor connected to the third transistor and a node between the first and second transistors.

21. A circuit comprising:
a pair of transistors forming a differential input stage;
a first set of four transistors forming a folded cascode circuit, wherein one transistor of the pair of differential input stage transistors is connected to a first node of the folded cascode circuit, and a second transistor of the pair of differential input stage transistors is connected to a second node of the of folded cascode circuit;
a second set of four transistors forming a mirror cascode circuit connected to the folded cascode circuit; and
a clamp circuit, the clamp circuit comprising:
a first comparator transistor having a source connected to the output node, and a gate connected to a clamp voltage;
a second comparator transistor having a drain connected to a drain of the first comparator transistor, a gate connected to a biasing voltage, and a source connected to a node in the mirror cascode circuit; and
a third transistor having a drain connected to the output node, and a source to a node of one branch connecting the folded cascode circuit and the mirror cascode circuit.

22. The circuit of claim 21, wherein the clamp circuit further comprises a fourth transistor having a drain and gate connected to a drain of the first comparator transistor, and a source connected to a source of the third transistor.

23. The circuit of claim 21, further comprising a clamp voltage generator circuit connected to the gate of the second comparator transistor.

24. The circuit of claim 23, wherein the clamp voltage generator circuit comprises:
a first clamp generator transistor having a gate and drain connected to the gate of the second comparator transistor and a source connected to a control voltage; and
a second clamp generator transistor having a drain connected to the gate and drain of the first clamp generator transistor, a source connected to the mirror cascode circuit, and a gate connected to a bias voltage.

* * * * *